(12) United States Patent
Cho et al.

(10) Patent No.: US 11,016,335 B2
(45) Date of Patent: May 25, 2021

(54) POLARIZING PLATE AND FLEXIBLE DISPLAY DEVICE INCLUDING THE SAME

(71) Applicant: LG Display Co., Ltd., Seoul (KR)

(72) Inventors: Won-Jong Cho, Paju-si (KR); Won-Ki Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/987,136

(22) Filed: Aug. 6, 2020

(65) Prior Publication Data

US 2020/0365064 A1 Nov. 19, 2020

Related U.S. Application Data

(62) Division of application No. 16/142,556, filed on Sep. 26, 2018, now Pat. No. 10,783,808.

(30) Foreign Application Priority Data

Sep. 28, 2017 (KR) .......................... 10-2017-0126432

(51) Int. Cl.
*G02F 1/1335* (2006.01)
*G02F 1/1333* (2006.01)
*H01L 51/52* (2006.01)

(52) U.S. Cl.
CPC .. G02F 1/133528 (2013.01); G02F 1/133305 (2013.01); H01L 51/5281 (2013.01); *G02F 1/133541* (2021.01)

(58) Field of Classification Search
CPC ... G02F 1/133528; G02F 2001/133531; G02F 1/13362; G02F 2001/133541; G02F 1/133305; G02F 1/133541; G02B 5/3025; G02B 6/0056; G02B 5/3033; G02B 27/26; Y10T 428/1041; H01L 51/0097; H01L 2251/5338; G09F 9/301; G06F 2203/04102
See application file for complete search history.

(56) References Cited

U.S. PATENT DOCUMENTS

| 2006/0181662 A1 | 8/2006 | Kameyama et al. |
| 2007/0065660 A1 | 3/2007 | Okamoto et al. |
| 2008/0137206 A1* | 6/2008 | Nakamura ........ C08F 222/1006 359/601 |

(Continued)

FOREIGN PATENT DOCUMENTS

| CN | 101128753 A | 2/2008 |
| CN | 101726912 A | 6/2010 |

(Continued)

OTHER PUBLICATIONS

First Office Action dated Sep. 3, 2020, issued in corresponding Chinese Patent Application No. 201810994300.4.

(Continued)

*Primary Examiner* — Jia X Pan
(74) *Attorney, Agent, or Firm* — Morgan, Lewis & Bockius LLP (57) ABSTRACT

A flexible display device includes a display panel configured to display an image, and a polarizing plate on the display panel. The flexible display device includes a folding area and a non-folding area. A first thickness of the polarizing plate in the folding area is greater than a second thickness of the polarizing plate in the non-folding area.

6 Claims, 8 Drawing Sheets

(56) References Cited

U.S. PATENT DOCUMENTS

| | | | |
|---|---|---|---|
| 2015/0144921 A1* | 5/2015 | Lim | H01L 51/5281 257/40 |
| 2015/0146386 A1* | 5/2015 | Namkung | G02F 1/133305 361/749 |
| 2015/0153495 A1* | 6/2015 | Matsuda | B05D 5/06 349/194 |
| 2015/0212548 A1 | 7/2015 | Namkung et al. | |
| 2016/0147361 A1 | 5/2016 | Ahn | |
| 2016/0291780 A1* | 10/2016 | Namkung | G02B 27/286 |
| 2017/0034906 A1 | 2/2017 | Myung et al. | |
| 2017/0045672 A1* | 2/2017 | Lee | G02F 1/1345 |
| 2017/0200915 A1 | 7/2017 | Lee et al. | |
| 2018/0108862 A1 | 4/2018 | Wang | |
| 2018/0173050 A1* | 6/2018 | Yaegashi | G02B 5/30 |
| 2018/0309086 A1 | 10/2018 | Li et al. | |
| 2018/0315951 A1 | 11/2018 | Seong et al. | |

FOREIGN PATENT DOCUMENTS

| | | |
|---|---|---|
| CN | 104659062 A | 5/2015 |
| CN | 105632344 A | 6/2016 |
| CN | 105679800 A | 6/2016 |
| CN | 106199812 A | 12/2016 |
| CN | 106409146 A | 2/2017 |
| CN | 106875851 A | 6/2017 |
| CN | 106960849 A | 7/2017 |
| CN | 107025007 A | 8/2017 |
| KR | 10-2014-0083409 A | 7/2014 |

OTHER PUBLICATIONS

"Modern Projection Display Technology", pp. 180-181, by Liu Xu and Li Haifeng, Published Mar. 30, 2009.

* cited by examiner

POLARIZING PLATE AND FLEXIBLE DISPLAY DEVICE INCLUDING THE SAME

CROSS-REFERENCE TO RELATED APPLICATIONS

This application is a Divisional Application of U.S. patent application Ser. No. 16/142,556, filed on Sep. 26, 2018, which claims the benefit under 35 U.S.C. § 119(a) of Korean Patent Application No. 2017-0126432, filed in Korea on Sep. 28, 2017, both of which are incorporated herein by reference in their entirety.

BACKGROUND

1. Technical Field

The present disclosure relates to a display device, and more particularly, to a flexible display device.

2. Discussion of the Related Art

Recently, as an information society progresses, the field of a display device capable of processing and displaying a large amount of information has been rapidly developed. For example, the development of various flat panel display devices has been in the spotlight.

Examples of a flat panel display device include a liquid crystal display (LCD) device, a plasma display panel (PDP) device, a field emission display (FED) device, an electroluminescence display (ELD) device, an organic light emitting diode (OLED), and the like. These flat panel display devices may include excellent performance in reduction of thickness, weight, and power consumption, in contrast with related art cathode ray tube (CRT) displays, which are being rapidly replaced with such flat panel display devices.

Meanwhile, the flat panel display device may use a glass substrate to withstand high-temperature heat generated during the manufacturing process, so there may be a limitation in providing a light weight, thinness, and flexibility.

For this reason, a flexible display device, which is manufactured using a flexible material such as a plastic instead of a glass substrate without flexibility to maintain the display performance if bent like paper, has been in the spotlight as a next-generation flat panel display device.

The flexible display device may utilize a thin film transistor substrate instead of glass, and may be classified into an unbreakable flexible display device having high durability, a bendable flexible display device, a rollable flexible display device, a foldable flexible display device, etc. Such a flexible display device may have advantages in space utilization and interior decoration and design, and may be used in various application fields.

For example, in order to realize a large-sized display device having an ultra-thin thickness, a light weight, and a compact structure, the bendable or foldable display device, which can be carried in a folded state and display an image in an unfolded state, has been actively, studied.

The bendable or foldable display device (hereinafter referred to as a "foldable display device") may be applied in various fields such as a TV and a monitor as well as a mobile device such as a mobile phone, an ultra-mobile PC, an electronic book, an electronic newspaper, or the like.

However, because the flexible display device may need to be folded or unfolded, the flexible display device may be provided in the form of a thin film, Impact resistance of such a flexible display device may be extremely weak.

For example, a polarizing plate may be drawn to have a stretching ratio—e.g., a ratio of the amount the polarizing plate is drawn (stretched) relative to its original, unstretched amount. A polarizing plate that is drawn to a maximum stretching ratio (e.g., stretched to a maximum amount before breaking) may frequently generate cracks in a folding area of the flexible display device.

Because the polarizing plate having cracks may degrade the display quality of the display panel, the polarizing plate having cracks may be discarded by removing the polarizing plate from the flexible display device. However, when it is difficult to remove the polarizing plate from the flexible display device, the flexible display device may be discarded.

Thus, the process efficiency and/or the production yield may be degraded.

SUMMARY

Accordingly, the present disclosure is directed to an emitting diode and an electroluminescent display device that substantially obviate one or more of the problems due to limitations and disadvantages of the related art.

An object of the present disclosure is to provide a polarizing plate capable of preventing a crack.

Another object of the present disclosure is to provide a flexible display device having high image quality.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the disclosure, as embodied and broadly described herein, there is provided a flexible display device, comprising a display panel configured to display an image; and a polarizing plate on the display panel, wherein the flexible display device includes a folding area and a non-folding area; and a first thickness of the polarizing plate in the folding area is greater than a second thickness of the polarizing plate in the non-folding area.

In another aspect, a flexible display device comprises a display panel configured to display an image; and a polarizing plate on the display panel and having a first stretching ratio in a folding area and a second stretching ratio in a non-folding area, wherein the second stretching ratio is greater than the first stretching ratio.

In another aspect, a polarizing plate for a flexible display device comprises a polarizing layer having a first stretching ratio in a first area and a second stretching ratio in a second area; and first and second TAC films on respective sides of the polarizing layer, wherein the second stretching ratio is greater than the first stretching ratio.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain the principles of embodiments of the disclosure. In the drawings.

DETAILED DESCRIPTION

Reference will now be made in detail to embodiments of the present disclosure, examples of which are illustrated in the accompanying drawings.

Figure 1A:
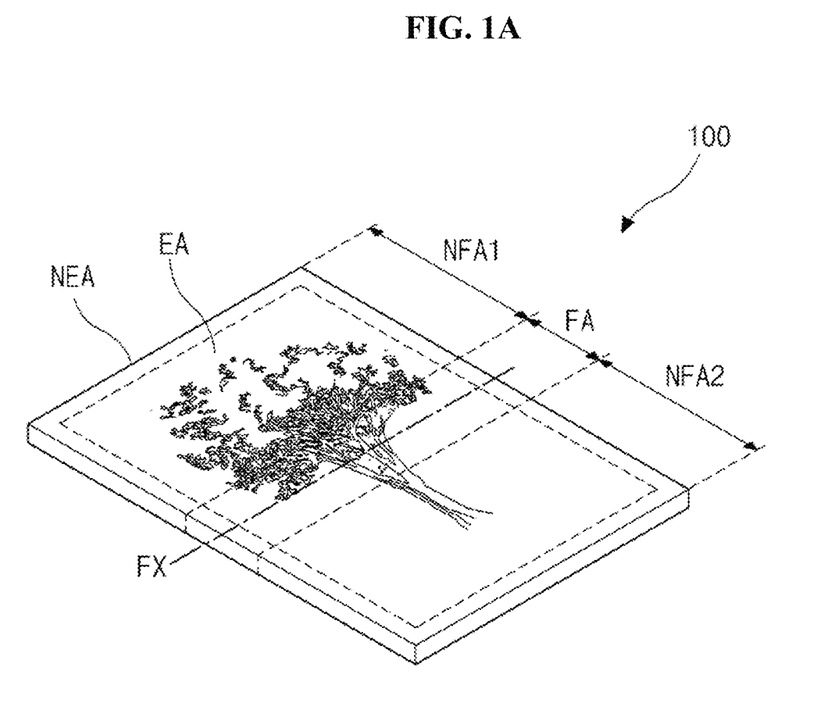
FIGS. 1A and 1B are perspective views showing a folded state and an unfolded state of a flexible display device according to a first embodiment of the present disclosure.
Figure 1B:
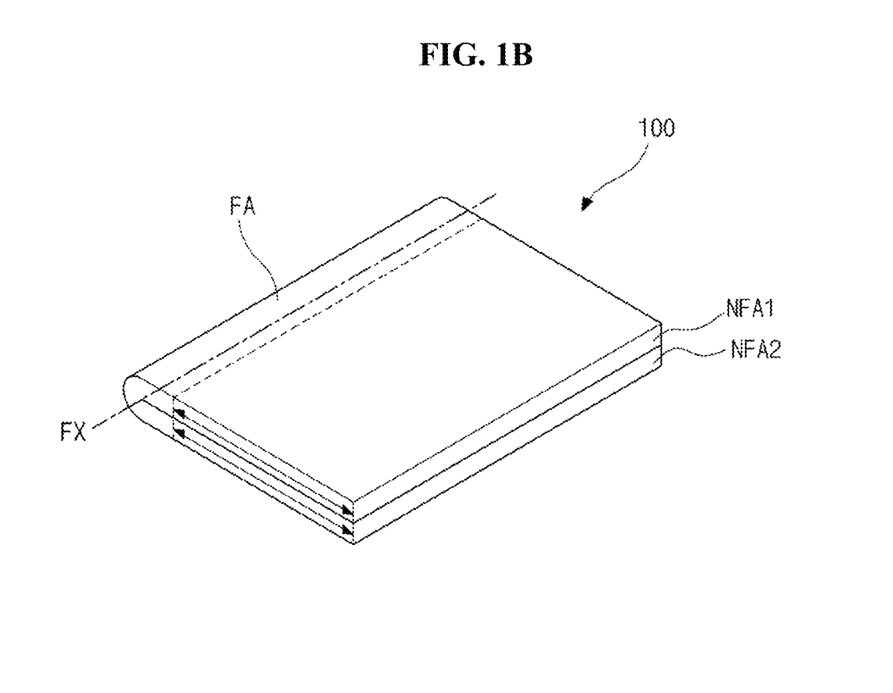

FIGS. 1A and 1B are perspective views showing a folded state and an unfolded state of a flexible display device according to a first embodiment of the present disclosure.

A foldable display device is shown as an example of a flexible display device 100 in the first embodiment of the present disclosure. However, the present disclosure is not limited thereto, and may be applied to various display devices (DD) such as a curved display device, a bendable display device, a rollable display device, and a stretchable display device.

Although not shown, the flexible display device 100 according to the first embodiment of the present disclosure may be applied to small to medium-sized electronic devices such as a cellular phone, a personal computer, a notebook computer, a personal digital terminal, a car navigation unit, a game machine, a portable electronic appliance, a wrist-watch-type electronic device, a camera, and the like as well as a large-sized electronic device such as a television or an external advertisement board.

As shown in FIGS. 1A and 1B, the flexible display device 100 includes a plurality of areas that are defined on a display surface. The flexible display device 100 may be divided into a display area (or "emission area") EA and a non-display area (or "non-emission area") NEA depending on whether an image is displayed. The display area EA is configured to display an image and the non-display area NEA is adjacent to the display area EA and does not display an image.

The non-display area NEA is located along edges of the display area EA. The flexible display device 100 may have a folding area FA, which is folded along the folding axis FX according to an action, as well as a first non-folding area NFA1 and a second non-folding area NFA2, which are not folded.

Figure 2A:
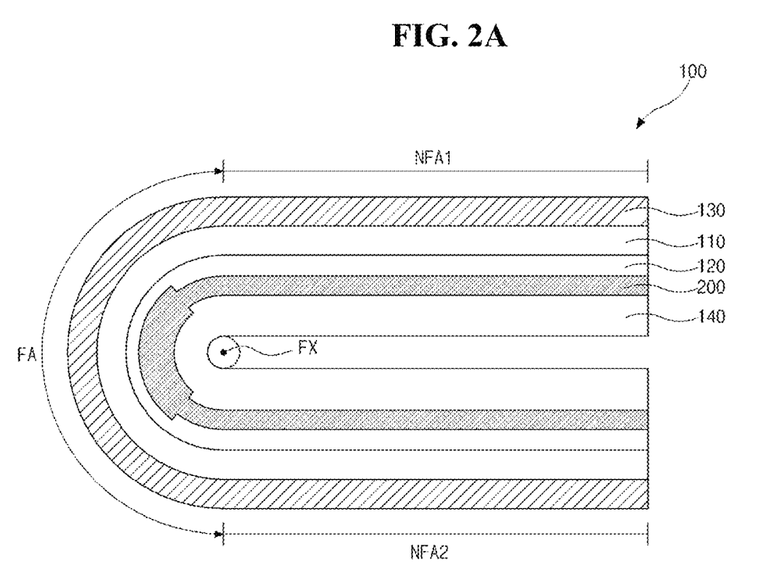
FIG. 2A is an enlarged sectional view showing the folded state of the flexible display device according to the first embodiment of the present disclosure.
Figure 2B:
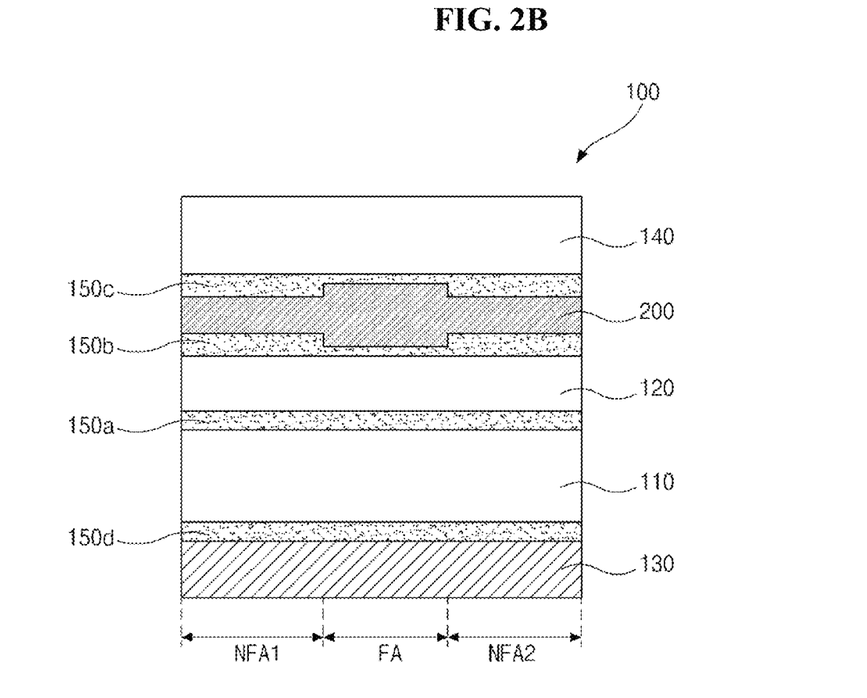
FIG. 2B is an enlarged sectional view showing the unfolded state of the flexible display device according to the first embodiment of the present disclosure.
Figure 2C:
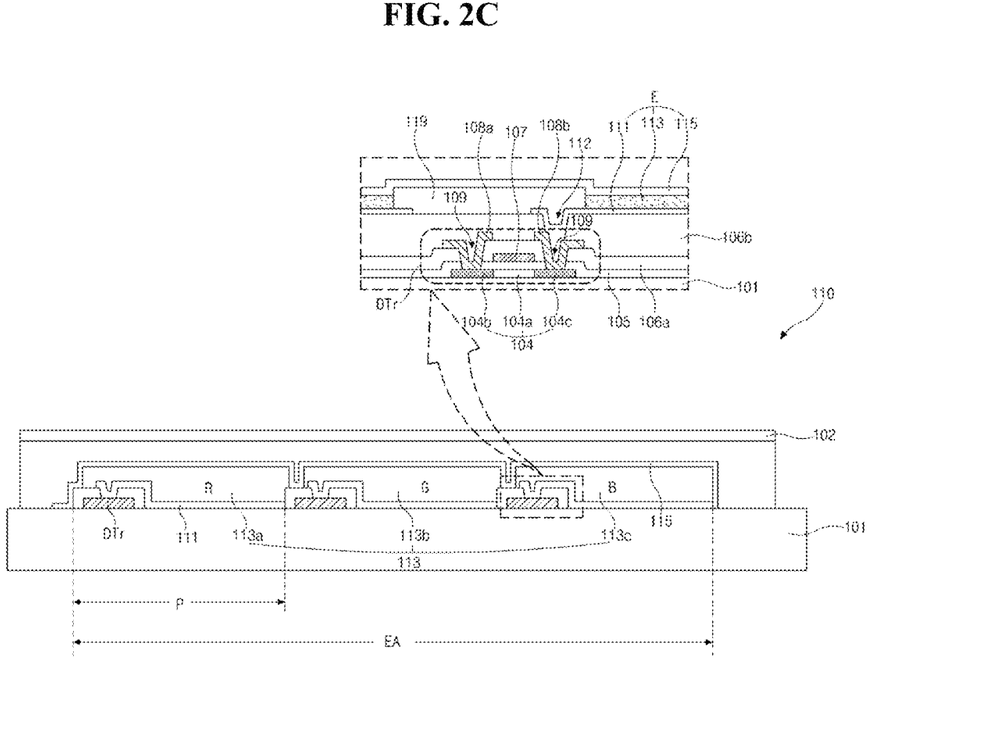
FIG. 2C is a sectional view showing a display panel of a flexible display device according to the first embodiment of the present disclosure.

FIGS. 2A and 2B are enlarged sectional views showing a folded state and an unfolded state of the flexible display device according to the first embodiment of the present disclosure, and FIG. 2C is a sectional view showing a display panel of the flexible display device.

As shown in FIG. 2A, the flexible display device 100 may be folded along the folding axis FX such that a display surface of the first non-folded area NFA1 faces a display surface of the second non-folded area NFA2.

As shown in FIGS. 2A and 2B, the flexible display device 100 includes a display panel 110 for displaying an image, a touch panel 120 including touch sensors (not shown), a back plate 130 for supporting the display panel 110, and a cover window 140 for protecting the display panel 110.

For the sake of convenience, it will be defined on the basis of the drawing that the back plate 130 is positioned on a rear surface of the display panel 110 and the cover window 140 is positioned forward of the display panel 110 when the display surface of the display panel 110 is directed forward. In addition, the touch panel 120 is positioned between the display panel 110 and the cover window 140.

The display panel 110 may be formed of one of a liquid crystal display (LCD) device, a plasma display panel (PDP) device, a field emission display (FED) device, an electroluminescence display (ELD) device, and an organic light emitting diode (OLED). In an example, the OLED, which is representative of a flexible display device capable of maintaining display performance even if it is bent like paper, is used as the display panel 110.

The OLED is a self-luminous element and does not require a backlight as used in a liquid crystal display device, which itself is a non-emissive element. Thus, the OLED may have a light weight and a slim structure.

In addition, in comparison to a liquid crystal display device, the OLED may be superior in terms of a viewing angle, a contrast ratio, power consumption, a direct current (DC) low-voltage driving, and a response speed. Further, because internal components of the OLED are formed in a solid, the OLED may be strong against an external impact and may have a wide operating temperature range.

Because the manufacturing process is simple, the OLED may remarkably reduce the manufacturing cost when compared to a liquid crystal display device.

In the display panel 110 formed of the OLED, a substrate 101 formed with a driving thin film transistor DTr and a light emitting diode E is encapsulated with a protective film 102.

Hereinafter, the display panel 110 (formed of the OLED (herein referred to as an OLED panel) will be described in more detail with reference to FIG. 2C.

A plurality of pixel regions P are defined on the display area EA formed on the substrate 101. A semiconductor layer 104 is formed in each pixel region P, and the semiconductor layer 104 is formed of silicon. An active area 104a constituting a channel is formed at the center of the semiconductor layer 104 and source and drain areas 104b and 104c doped with impurities at high concentration are formed on both sides of the active area 104a.

A gate insulating layer 105 is formed on the semiconductor layer 104. A gate electrode 107 and a gate line (not shown), which extends in one direction, are formed on the gate insulating layer 105 in correspondence with the active area 104a of the semiconductor layer 104.

In addition, a first interlayer insulating layer 106a is formed on the entire top surface of the gate electrode 107 and the gate line (not shown). In addition, the first interlayer insulating layer 106a and the gate insulating layer 105 formed under the first interlayer insulating layer 106a have first and second semiconductor layer contact holes 109 for exposing the source and drain areas 104b and 104c located on both sides of the active area 104a, respectively.

Source and drain electrodes 108a and 108b, which are spaced apart from each other and are in contact with the source and drain areas 104b and 104c exposed through the first and second semiconductor layer contact holes 109, respectively, are formed on the first interlayer insulating layer 106a including the first and second semiconductor layer contact holes 109.

In addition, a second interlayer insulating layer 106b having a drain contact hole 112 for exposing the drain electrode 108b is formed on the source and drain electrodes 108a and 108b and the first interlayer insulating layer 106a exposed between the source and drain electrodes 108a and 108b.

In this case, the source and drain electrodes 108a and 108b, the semiconductor layer 104 including the source and drain areas 104b and 104c in contact with the source and drain electrodes 108a and 108b, the gate insulating layer 105 formed on the semiconductor layer 104, and the gate electrode 107 may constitute the driving thin film transistor DTr.

Data lines (not shown) which cross gate lines (not shown) are provided to define the pixel region P. A switching thin film transistor (not shown) may have the same structure as the driving thin film transistor DTr and is connected to the driving thin film transistor DTr.

In FIG. 2C, as an example, the switching thin film transistor (not shown) and the driving thin film transistor DTr are shown as a co-planar type transistor, in which the semiconductor layer 104 is formed of a polysilicon semiconductor layer. Alternatively, the switching thin film transistor and the driving thin film transistor DTr may be provided as a bottom gate type transistor in which the semiconductor layer 104 is formed of pure and impure amorphous silicon.

In addition, a first electrode 111 is formed on a predetermined area of the second interlayer insulating layer 106b where the image is actually displayed. For example, the first electrode 111 serves as an anode of a light emitting diode E and is formed of a material having a relatively high work function value.

The first electrode 111 is connected to the drain electrode 108b of the driving thin film transistor DTr, and the first electrode 111 is formed in each pixel region P. A bank 119 is interposed between the first electrodes 111 formed in each pixel region P.

That is, the bank 119 may serve as a boundary between the pixel regions P so that the first electrodes 111 formed in the pixel regions P may be isolated from each other by the bank 119.

In addition, an organic light emitting layer 113 is formed on the first electrode 111.

The organic light emitting layer 113 may be configured as a single layer formed of a light emitting material or may be configured as a multiple layer including a hole injection layer, a hole transport layer, a light emitting layer, an electron transport layer, and an electron injection layer, in order to improve light emitting efficiency.

In addition, a second electrode 115 serving as a cathode is formed on the entire surface of the organic light emitting layer 113.

The second electrode 115 has a dual layer structure and includes a semitransparent metal film, which is formed by thinly depositing a metal material having a low work function. In this case, the second electrode 115 may have the dual layer structure in which a transparent conductive material is thickly deposited on the semitransparent metal film.

Accordingly, light emitted from the organic light emitting layer 113 is directed to the second electrode 115, which is called a top emission type method.

Alternatively, the second electrode 115 may be formed of an opaque metal film and the light emitted from the organic light emitting layer 113 may be directed to the first electrode 111, which is called a bottom emission type method.

In the OLED panel 110, when a predetermined voltage is applied to the first electrode 111 and the second electrode 115 in response to a selected color signal, holes injected from the first electrode 111 and electrons provided from the second electrode 115 are transported to the organic light emitting layer 113 to form excitons. When the excitons transition from the excited state to the ground state, light is generated and emitted in the form of visible light.

In this case, the emitted light passes through the transparent second electrode 115 or the first electrode 111 and exits to the outside, so that the OLED panel 110 displays an image.

The protective film 102 in the form of a thin film is formed on the driving thin film transistor DTr and the light emitting diode E so that the OLED panel 110 is encapsulated by the protective film 102. In order to prevent external oxygen and moisture from penetrating into the OLED panel 110, at least two inorganic protective films are laminated and used. In this case, an organic protective film may be interposed between the two inorganic protective films to reinforce the impact resistance of the inorganic protective film.

Meanwhile, the substrate 101 may be formed of a thin polyimide to have a flexible property. However, the substrate 101 formed of the thin polyimide may not be suitable for the process of forming a component such as the thin film transistor DTr, so the process of forming the component such as the thin film transistor DTr may be performed in a state in which a substrate formed of a polyimide is attached to a carrier substrate such as a glass substrate. The OLED panel 110 may be obtained by separating the carrier substrate from the polyimide substrate.

A touch panel 120 is disposed on the OLED panel 110. Although not shown, the touch panel 120 includes a first touch film (not shown) having a first touch electrode (not shown) and a second touch film (not shown) having a second touch electrode (not shown), which are spaced apart from each other while facing each other.

The first touch electrode (not shown) is deposited on an entire surface of the first touch film (not shown), and the first touch electrode (not shown) is formed of a transparent conductive material such as indium tin oxide (ITO) or indium zinc oxide (IZO).

In addition, the second touch electrode (not shown) is formed on the second touch film (not shown) facing the first touch film (not shown). The second touch electrode is provided in a bar shape to be spaced apart from each other by a predetermined interval and is formed of a metal material such as aluminum (Al) or an aluminum alloy (AlNd), magnesium (Mg), gold (Au), silver (Ag), or the like.

The first and second touch electrodes (not shown) may constitute a touch sensor (not shown).

Accordingly, when a predetermined input device such as a finger or a pen touches an upper portion of the first touch film (not shown), the first touch electrode (not shown) formed on the first touch film (not shown) and the second touch electrode (not shown) formed on the second touch film (not shown) are electrically connected, so that a voltage value of the touch point may be changed according to a resistance value of the touch point. Thus, a control device may find position coordinates based on the variation of the potential difference.

The touch panel 120 and the OLED panel 110 are integrally modularized through the cover window 140 and the back plate 130. The touch panel 120 and the cover window 140 for protecting the OLED panel 110 are disposed at a front surface of the OLED panel 110 that displays an image, and the back plate 130 for supporting the OLED panel 110 is disposed at a rear surface of the OLED panel 110.

The cover window 140 protects the OLED panel 110 and the touch panel 120 from an external impact and transmits light emitted from the OLED panel 110 so that the image displayed on the OLED panel 110 is visible to the outside.

The cover window 140 may be formed of a polymeric material having impact resistance and light transmittance properties, such as polymethylmethacrylate (PMMA), polycarbonate (PC), a cycloolefin polymer (COP), polyethylene terephthalate (PET), a polyimide (PI), or a polyaramid (PA).

In addition, because the substrate 101 of the OLED panel 110 is very thin, the back plate 130 is attached to the rear surface of the OLED panel 110 to support the OLED panel 110.

Meanwhile, because the display panel 110 is formed of an OLED in the flexible display device 100 according to the first embodiment of the present disclosure, a polarizing plate 200 is disposed at an outer surface of the OLED panel 110, through which light is transmitted, in order to prevent the contrast from being lowered due to external light.

That is, when the OLED panel 110 is in the driving mode for displaying an image, the polarizing plate 200 for blocking the external light incident from the outside is positioned in a transmission direction of light emitted through the organic light emitting layer 113, thereby improving the contrast.

The polarizing plate 200 is a circular polarizing plate for blocking external light. Thus, the flexible display device 100 according to the first embodiment of the present disclosure may reduce and/or minimize the reflection of the external light by using the polarizing plate 200, thereby preventing the contrast from being lowered.

In the flexible display device 100 according to the first embodiment of the present disclosure, a linear polarizing plate 210 (see FIG. 3A) of the polarizing plate 200 is drawn 2 times to 5 times (e.g., 2 to 5 times its original amount) in a folding area FA, and is drawn 6 times (e.g., 6 times its original amount), which is the maximum stretching ratio, in first and second non-folding areas NFA1 and NFA2.

The stretching ratio will be described below in more detail.

With reference to FIG. 2B, the OLED panel 110 and the touch panel 120 are combined with each other through a first optical adhesive layer 150a, the touch panel 120 and the polarizing plate 200 are combined with each other through a second optical adhesive layer 150b, and the polarizing plate 200 and the cover window 140 are combined with each other through a third optical adhesive layer 150c. In addition, the OLED panel 110 and the back plate 130 are combined with each other through a fourth optical adhesive layer 150d so that the flexible display device 100 is integrally modularized.

The first to fourth optical adhesive layers 150a, 150b, 150c and 150d are formed of an optically clear adhesive (OCA) and may have a thickness in the range of 100 μm to 300 μm.

When the first to fourth optical adhesive layers 150a, 150b, 150c and 150d have a thickness of 100 μm or less, the adhesive force is so weak that the cover window 140, the back plate 130, the polarizing plate 200, the touch panel 120, and the OLED panel 110 may not be integrally modularized. When the first to fourth optical adhesive layers 150a, 150b, 150c and 150d have a thickness of 300 μm or more, the flexible display device 100 may not be easily folded.

As described above, in the flexible display device 100 according to the first embodiment of the present disclosure, the polarizing plate 200 provided to prevent the contrast from being lowered due to external light is divided into the folding area FA and the non-folding areas NFA1 and NFA2. The polarizing plate 200 is drawn 2 times to 5 times in the folding area FA, and is drawn 6 times—which is the maximum stretching ratio—in the non-folding areas NFA1 and NFA2, thereby preventing cracks from being generated in the folding area FA when the flexible display device 100 is folded or unfolded.

As a result, the display quality of the flexible display device 100 may be prevented from degrading, and the process efficiency can be improved because it may not be necessary to remove the polarizing plate having cracks.

Figure 3A:
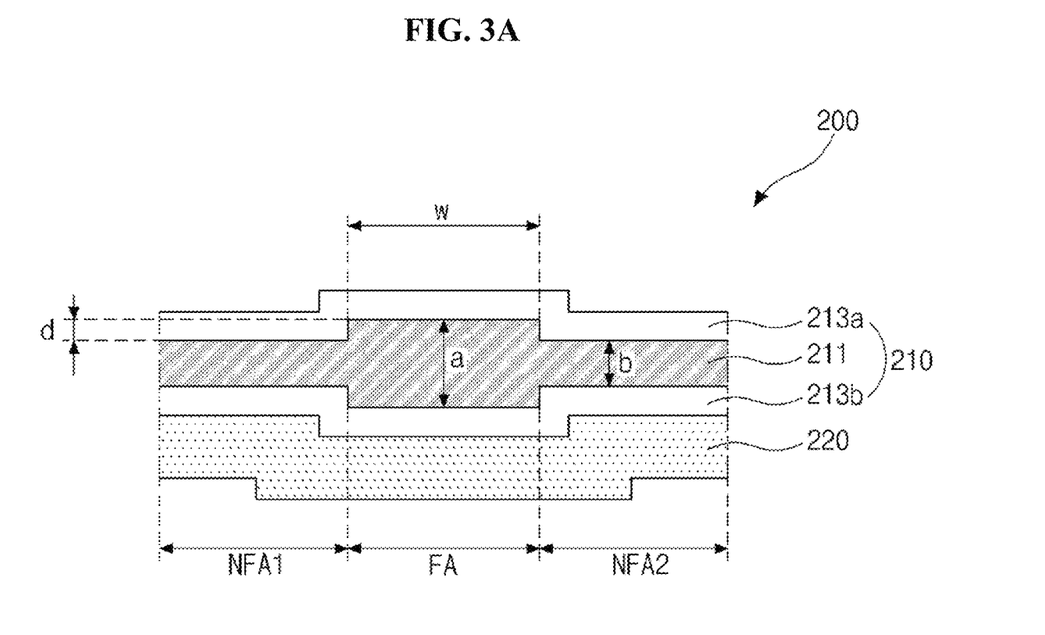
FIGS. 3A and 3B are sectional views showing a polarizing plate according to the first embodiment of the present disclosure.
Figure 3B:
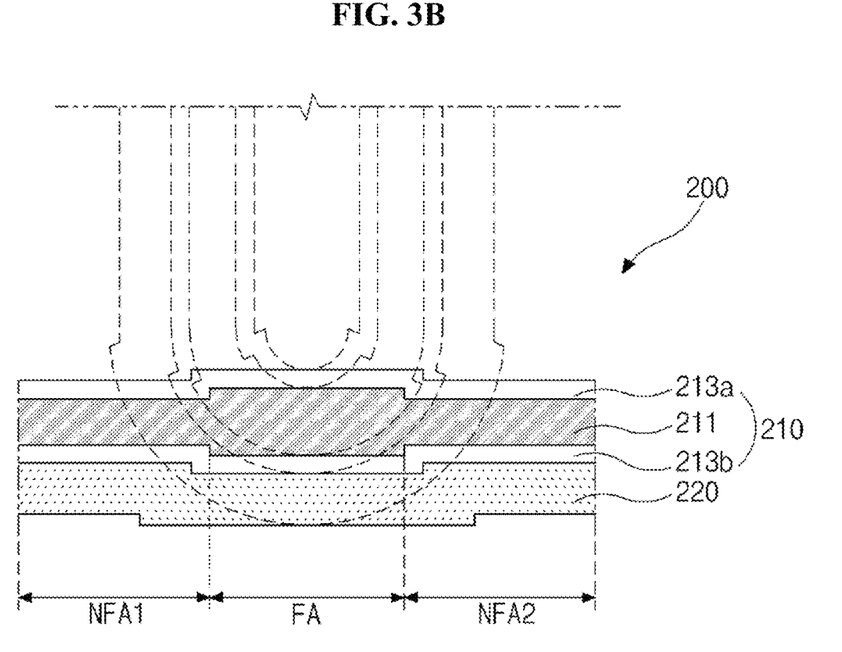

FIGS. 3A and 3B are sectional views showing the polarizing plate according to the first embodiment of the present disclosure.

As shown in FIGS. 3A and 3B, the polarizing plate 200 includes a retarder 220 and a linear polarizing plate 210 positioned on the retarder 220. With regard to the arrangement of the linear polarizing plate 210 and the retarder 220, the linear polarizing plate 210 may be arranged closely to an incident direction of external light, and the retarder 220 is arranged inward of the linear polarizing plate 210.

The linear polarizing plate 210 includes a polarizing layer 211 for changing the polarizing property of light and first and second cellulose triacetate (TAC) films 213a and 213b formed on both sides of the polarizing layer 211 to protect and support the polarizing layer 211.

The linear polarizing plate 210 absorbs linearly polarized light parallel to an absorption axis of the polarizing layer 211 and transmits linearly polarized light perpendicular to the absorption axis, that is, the linearly polarized light parallel to a transmission axis.

The polarizing layer 211 may be formed of poly-vinyl alcohol (PVA), which is drawn and coated with iodine ions or dichroic dyes, in which the polarizing layer 211 is drawn 2 times to 5 times in the folding area FA, and is drawn 6 times, which is the maximum stretching ratio, in the non-folding areas NFA1 and NFA2.

That is, the polarizing plate 200 has the folding area FA, which is folded to form a curvature when the flexible display device 100 (see FIG. 2B) is folded, and the non-folding areas NFA1 and NFA2, which are formed at both sides of the folding area FA and maintain a flat state when the flexible display device 100 (see FIG. 2B) is folded.

In this case, the polarizing layer 211 is drawn 2 times to 5 times in the folding area FA and is drawn 6 times, which is the maximum stretching ratio, in the non-folding areas NFA1 and NFA2.

In this manner, the stretching ratio in the folding area FA is lower than the stretching ratio in the non-folding areas NFA1 and NFA2, so that a thickness of the polarizing layer 211 in the folding area FA is greater than a thickness of the polarizing layer 211 in the non-folding areas NFA1 and NFA2.

In this case, because the polarizing layer 211 in the folding area FA is thicker than the polarizing layer 211 in the non-folding areas NFA1 and NFA2, the first and second TAC films 213a and 213b located on both sides of the polarizing layer 211 may have a step between the folding area FA and the non-folding areas NFA1 and NFA2 corresponding to the thickness of the polarizing layer 211.

In addition, the retarder 220 positioned on the linear polarizing plate 210 is a quarter wave plate (QWP) having a phase retardation value of ¼λ.

Further, the retarder 220 also has a step between the folding area FA and the non-folding areas NFA1 and NFA2 corresponding to the step of the second TAC film 213b.

Therefore, in the overall thickness of the polarizing plate 200, when the folding area FA has a first thickness 'a', the non-folding areas NFA1 and NFA2 have a second thickness b smaller than the first thickness 'a'.

Accordingly, the flexible display device 100 (see FIG. 2B) according to the first embodiment of the present disclosure may prevent cracks from being generated in the polarizing plate 200 in the folding area FA when the flexible display device 100 is folded or unfolded.

That is, the polarizing plate 200 may be drawn at the maximum stretching ratio to improve the degree of polarization, and in an example, the maximum stretching ratio of the polarizing plate 200 is 6 times.

However, when the polarizing plate 200 is folded after stretching the polarizing plate 200 at the maximum stretching ratio, an additional stretching may not occur inside the polarizing plate 200, so that the tensile stress generated in the neutral plane (NP) exceeds a critical point, thereby generating cracks such as tearing in the polarizing plate 200.

In contrast, because the polarizing plate 200 of the flexible display device 100 (see FIG. 2B) according to the first embodiment of the present disclosure is configured to draw the polarizing layer 211 2 times to 5 times in the folding area FA, an additional stretching may occur inside the polarizing layer 211.

Thus, even when the polarizing plate 200 is folded, the tensile stress generated in the neutral plane of the polarizing plate 200 is less than the critical point, so that cracks can be prevented from being generated in the polarizing plate 200.

As a result, it may be possible to prevent the display quality of the flexible display device (100 of FIG. 2B) from being lowered, and the process efficiency may be improved because it is not necessary to remove the polarizing plate having cracks.

The first and second thicknesses 'a' and 'b' of the polarizing plate 200 in the folding area FA and the non-folding areas NFA1 and NFA2 may satisfy the following Equation 1.

$$a=\{(b-z)/6\}x+z \qquad \text{Equation 1}$$

In Equation 1, 'z' is an initial thickness before stretching, and 'x' is a stretching ratio in the folding area FA.

When the polarizing layer 211 in the non-folding areas NFA1 and NFA2 has the second thickness b of 10 μm under the conditions that the initial thickness of the polarizing layer 211 before stretching is 30 μm and the polarizing layer 211 is stretched at the maximum stretching ratio of 6 times, the polarizing layer 211 in the folding area FA has the first thickness 'a' of 13.4 μm when stretched 5 times, 16.7 μm when stretched 4 times, 20 μm when stretched 3 times, and 23.3 μm when stretched 2 times.

Therefore, in an example, the ratio a/b of the first thickness 'a' to the second thickness 'b' satisfies the following Equation 2.

$$1(\text{Min}) < a/b \leq 2.3(\text{Max}) \qquad \text{Equation 2}$$

With reference to Table 1 below, the drawn state may not be stably maintained due to the elastic restoring property when the polarizing layer 211 is drawn 2 times or less in the process of stretching the polarizing layer 211, so that the polarizing layer 211 is substantially drawn 2 times or less.

TABLE 1

| Stretching ratio | First thickness (folding area) | Second thickness (non-folding area) | a/b |
|---|---|---|---|
| 6 times | 10 μm | 10 μm | 1 |
| 5 times | 13.4 μm | 10 μm | 1.3 |
| 4 times | 16.7 μm | 10 μm | 1.7 |
| 3 times | 20 μm | 10 μm | 2 |
| 2.5 times | 23.3 μm | 10 μm | 2.3 |

Therefore, in the flexible display device 100 (see FIG. 2B) according to the first embodiment of the present disclosure, the first thickness 'a' of the polarizing plate 200 in the folding area FA may not exceed 23 μm, and the polarizing plate 200 is drawn 2 times to 5 times to have the stretching ratio lower than the maximum stretching ratio to satisfy Equation 2.

Particularly, the ratio a/b of the first and second thicknesses 'a' and 'b' in the folding area FA and non-folding areas NFA1 and NFA2 of the polarizing plate 200 of the flexible display device 100 (see FIG. 2B) according to the first embodiment of the present disclosure may satisfy the following Equation 3.

$$1(\text{Min}) < a/b \leq 1.3(\text{Max}) \qquad \text{Equation 3}$$

That is, since the polarizing performance may be improved as the stretching ratios of the folding area FA and the non-folding areas NFA1 and NFA2 become more similar, the folding area FA may be designed such that the difference between the stretching ratio of the folding area FA and the maximum stretching ratio of the non-folding areas NFA1 and NFA2 is as small as possible.

Therefore, the folding area FA may be drawn 5 times, which is similar to the stretching ratio of the non-folding areas NFA1 and NFA2 drawn at the maximum drawn ratio, and in an example, the first thickness 'a' is designed to be 13.4 μm closest to the second thickness b.

When the stretching ratio of the folding area FA is set to 5 times, the folding area FA has an additional stretching margin of 17% as compared with the non-folding areas NFA1 and NFA2. Therefore, even if the polarizing plate 200 is folded, the tensile stress generated in the neutral plane of the polarizing plate 200 is less than the critical point, so cracks may be prevented from being generated in the polarizing plate 200.

As a result, it may be possible to prevent the display quality of the flexible display device 100 (see FIG. 2B) from being lowered, and the process efficiency may be improved because it is not necessary to remove the polarizing plate having cracks.

In addition, the folding area FA having the first thickness 'a' that is thicker than the second thickness 'b' of the non-folding areas NFA1 and NFA2 has a step difference with respect to the non-folding areas NFA1 and NFA2, and the step difference may satisfy the following Equation 4 with reference to Table 2 below.

TABLE 2

| Stretching ratio | First thickness (folding area) | Second thickness (non-folding area) | a/b | d (=(a − b)/2) |
|---|---|---|---|---|
| 5 times | 13.4 μm | 10 μm | 1.3 | 1.7 μm |
| 4 times | 16.7 μm | 10 μm | 1.7 | 3.4 μm |
| 3 times | 20 μm | 10 μm | 2 | 5.0 μm |
| 2.5 times | 23.3 μm | 10 μm | 2.3 | 6.7 μm |

With reference to Table 2, the step difference 'd' between the folding area FA and the non-folding areas NFA1 and NFA2 may be set in the range of 6.7 µm to 1.7 µm. Actually, the step difference may be variously set depending on the stretching ratios of the folding area FA and the non-folding areas NFA1 and NFA2 within the thickness of the second and third optical adhesive layers 150b and 150c (see FIG. 2B) disposed on both sides of the polarizing plate 200.

Because the optical adhesive layers 150a, 150b, 150c and 150d of the flexible display device 100 according to an embodiment of the present disclosure have an ultra-thin thickness of 25 µm or less, the step difference between the folding area FA and the non-folding areas NFA1 and NFA2 may be defined as shown in the following Equation 4.

$$1.7 \text{ µm} < d \leq 25 \text{ µm} \quad \text{Equation 4}$$

As described above, in the flexible display device 100 (see FIG. 2B) according to the first embodiment of the present disclosure, the polarizing layer of the polarizing plate 200 is drawn 2 times to 5 times in the folding are FA and is drawn 6 times—which is the maximum stretching ratio—in the non-folding areas NFA1 and NFA2, thereby preventing cracks from being generated in the polarizing plate 200 in the folding area FA when the flexible display device 100 (see FIG. 2B) is folded or unfolded.

As a result, it may be possible to prevent the display quality of the flexible display device 100 (see FIG. 2B) from being lowered, and the process efficiency maybe be improved because it is not necessary to remove the polarizing plate having cracks.

Figure 4:
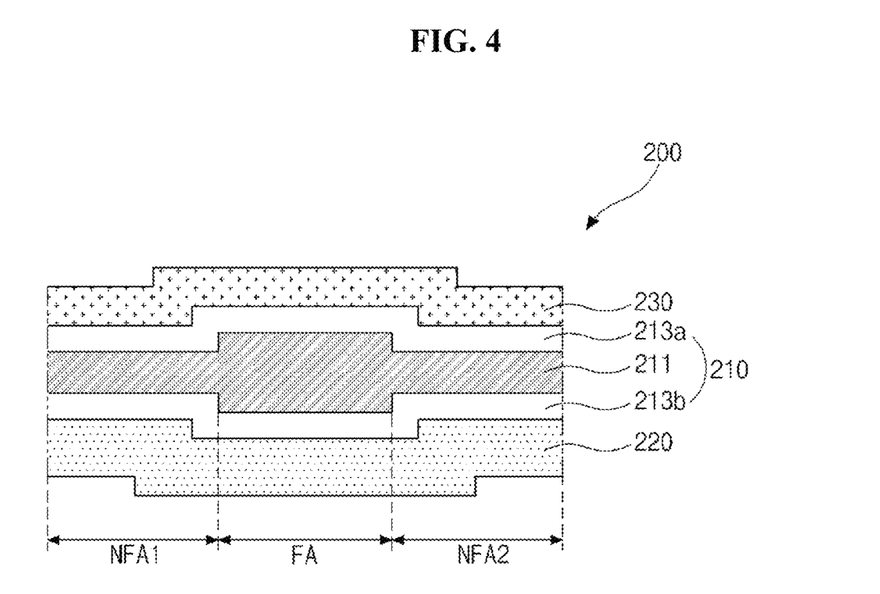
FIG. 4 is a sectional view showing a polarizing plate according to a second embodiment of the present disclosure.

FIG. 4 is a sectional view showing the polarizing plate according to a second embodiment of the present disclosure.

In order to avoid redundant descriptions, the same parts as those of the first embodiment described above will be denoted by the same reference numerals.

As shown in FIG. 4, a polarizing plate 200 according to the second embodiment of the present disclosure includes a retarder 220 and a linear polarizing plate 210 positioned on the retarder 220, and the linear polarizing plate 210 includes a polarizing layer 211 for changing the polarizing property of light and first and second TAC films 213a and 213b formed on both sides of the polarizing layer 211 to protect and support the polarizing layer 211.

The linear polarizing plate 210 absorbs linearly polarized light parallel to an absorption axis of the polarizing layer 211 and transmits linearly polarized light perpendicular to the absorption axis, that is, the linearly polarized light parallel to a transmission axis.

The polarizing layer 211 may be formed of poly-vinyl alcohol (PVA), which is drawn and coated with iodine ions or dichroic dyes, in which the polarizing layer 211 is drawn 2 times to 5 times in the folding area FA, and is drawn 6 times—which is the maximum stretching ratio—in the non-folding areas NFA1 and NFA2.

In this manner, the stretching ratio in the folding area FA is lower than the stretching ratio in the non-folding areas NFA1 and NFA2, so that a thickness of the polarizing layer 211 in the folding area FA is greater than a thickness of the polarizing layer 211 in the non-folding areas NFA1 and NFA2.

In this case, because the polarizing layer 211 in the folding area FA is thicker than the polarizing layer 211 in the non-folding areas NFA1 and NFA2, the first and second TAC films 211 and 221 located on both sides of the polarizing layer 211 may have a step between the folding area FA and the non-folding areas NFA1 and NFA2 corresponding to the thickness of the polarizing layer 211.

In addition, the retarder 220 positioned under the linear polarizing plate 210 is a quarter wave plate (QWP) having a phase retardation value of ¼λ.

Further, the retarder 220 also has a step between the folding area FA and the non-folding areas NFA1 and NFA2 corresponding to the step of the second TAC film 213b.

Therefore, in the overall thickness of the polarizing plate 200, when the folding area FA has a first thickness 'a', the non-folding areas NFA1 and NFA2 have a second thickness 'b' smaller than the first thickness 'a'.

The polarizing plate 200 according to the second embodiment of the present disclosure further includes a surface treatment layer 230 positioned on the linear polarizing plate 210, that is, on the first TAC film 213a.

The surface treatment layer 230 is formed of an anti-glare layer including a silica bead (not shown) and has a haze characteristic.

The haze characteristic refers to a phenomenon in which, when light passes through a transparent material, an opaque blurred image appears due to light diffusion caused by the intrinsic properties of the transparent material other than reflection or absorption, and light transmittance becomes higher as the haze characteristic value is lowered.

The surface treatment layer 230 according to the second embodiment of the present disclosure is configured to have an external haze characteristic in the range of 10% to 11% and an internal haze characteristic in the range of 20% to 33%. The external haze characteristic refers to a haze characteristic realized by the surface treatment layer 230 itself and the internal haze characteristic refers to a haze characteristic realized by the silica bead (not shown) contained inside the surface treatment layer 230.

In this case, the total haze characteristic due to the external haze characteristic and the internal haze characteristic may be set to 20% or more.

Because the surface treatment layer 230 having the haze characteristic is provided outside the polarizing plate 200, the difference in visibility between the folding area FA and the non-folding areas NFA1 and NFA2 may be reduced and/or minimized in the unfolded state of the flexible display device 100 (see FIG. 2B).

That is, in the polarizing plate 200 according to the second embodiment of the present disclosure, the stretching ratio in the folding area FA is different from the stretching ratio in the non-folding areas NFA1 and NFA2 in order to prevent cracks from being generated in the folding area FA when the flexible display device 100 (see FIG. 2B) is folded, so a difference in visibility may occur when the flexible display device 100 (see FIG. 2B) is unfolded due to the difference in the degree of polarization between the folding area FA and the non-folding areas NFA1 and NFA2.

Figure 5:
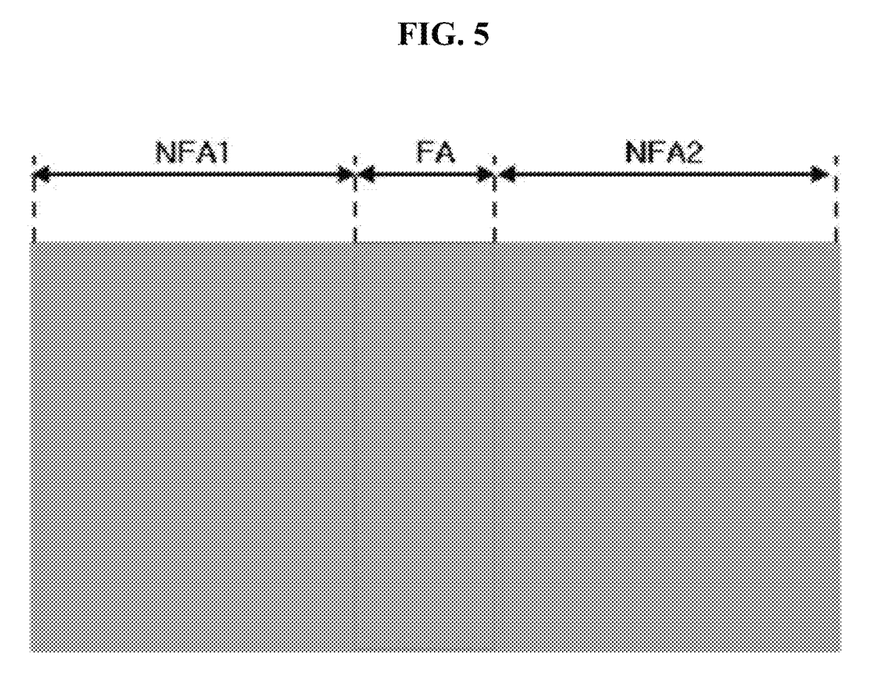
FIG. 5 is a simulation result obtained by measuring a difference in visibility between a folding area and a non-folding area of a flexible display device according to the second embodiment of the present disclosure.

However, as described above, because the surface treatment layer 230 having the haze characteristic is provided outside the polarizing plate 200, it may be possible to reduce and/or minimize the difference in visibility between the folding area FA and the non-folding areas NFA1 and NFA2 in the unfolded state of the flexible display device 100 (see FIG. 2B) as shown in FIG. 5.

In this case, the surface treatment layer 230 may be provided in a cover window 140 (see FIG. 2B) positioned at the outermost side of the flexible display device 100 (see FIG. 2B). The surface treatment layer 230 may have an external haze characteristic of 10% to 23% and an internal haze of 2% to 33% when the surface treatment layer 230 is provided in the cover window 140.

In this case, the total haze characteristic due to the external haze characteristic and the internal haze characteristic may be set to 20% or more.

As described above, in the flexible display device 100 (see FIG. 2B) according to the second embodiment of the present disclosure, the polarizing layer 211 of the polarizing plate 200 is drawn 2 times to 5 times in the folding area FA and is drawn 6 times—which is the maximum stretching ratio—in the non-folding areas NFA1 and NFA2, thereby preventing cracks from being generated in the polarizing plate 200 in the folding area FA when the flexible display device 100 (see FIG. 2B) is folded.

As a result, it may be possible to prevent the display quality of the flexible display device 100 (see FIG. 2B) from being lowered, and the process efficiency may be improved because it is not necessary to remove the polarizing plate having cracks.

Particularly, because the surface treatment layer 230 having the haze characteristic is provided outside the polarizing plate 200, the difference in visibility due to the difference in the degree of polarization between the folding area FA and the non-folding areas NFA1 and NFA2 may be reduced and/or minimized in the unfolded state of the flexible display device 100 (see FIG. 2B).

Meanwhile, although it has been illustrated and described that the touch panel 120 (see FIG. 2B) is positioned on the OLED panel 110 (see FIG. 2B) for displaying an image in the flexible display device (see FIG. 2B), the touch panel 120 (see FIG. 2B) may be omitted.

Although the OLED panel 110 (FIG. 2B) has been described as an example of the display panel in the present disclosure, a liquid crystal panel may be used as the display panel. When the liquid crystal panel is used as the display panel, the polarizing plate 200 according to the embodiment of the present disclosure may be positioned on both sides of the liquid crystal panel.

It will be apparent to those skilled in the art that various modifications and variations can be made in the embodiments of the present disclosure without departing from the spirit or scope of the disclosure. Thus, it is intended that the present disclosure cover the modifications and variations of this disclosure provided they come within the scope of the appended claims and their equivalents.

What is claimed is:

1. A polarizing plate for a flexible display device, comprising:
    a polarizing layer having:
    a first stretching ratio in a first area; and
    a second stretching ratio in a second area; and
    first and second TAC films on respective sides of the polarizing layer,
    wherein the second stretching ratio is greater than the first stretching ratio,
    wherein both the first and the second areas have a polarizing property, and
    wherein the first area of the polarizing layer protrudes from two opposite surfaces relative to the second area.

2. The polarizing plate of claim 1, wherein:
    the polarizing layer has:
    a first thickness in the first area; and
    a second thickness in the second area; and
    the second thickness is smaller than the first thickness.

3. The polarizing plate of claim 2, wherein a ratio of the first thickness to the second thickness is greater than 1, and less than or equal to 2.3.

4. The polarizing plate of claim 1, further comprising a retarder under the second TAC film.

5. The polarizing plate of claim 1, further comprising:
    a surface treatment layer having:
    an external haze characteristic; and
    an internal haze characteristic,
    wherein the external haze characteristic is lower than the internal haze characteristic.

6. The polarizing plate of claim 5, wherein:
    the external haze characteristic is 10% to 11%; and
    the internal haze characteristic is 20% to 33%.

* * * * *